(12) United States Patent
Mouri et al.

(10) Patent No.: US 6,659,334 B2
(45) Date of Patent: Dec. 9, 2003

(54) METHOD FOR FORMING END-FACE ELECTRODE

(75) Inventors: Hiroaki Mouri, Komatsu (JP); Joji Shibata, Komatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/955,806

(22) Filed: Sep. 19, 2001

(65) Prior Publication Data

US 2002/0066776 A1 Jun. 6, 2002

(30) Foreign Application Priority Data

Sep. 21, 2000 (JP) ........................................ 2000-287337
Jun. 5, 2001 (JP) ........................................ 2001-168992

(51) Int. Cl.⁷ ........................... B23K 31/00; B23K 31/02
(52) U.S. Cl. ..................................... 228/248.1; 228/215
(58) Field of Search ........................ 228/248.1, 215, 228/223

(56) References Cited

U.S. PATENT DOCUMENTS 5,135,891 A * 8/1992 Ikeno et al. ................. 438/123
5,898,344 A * 4/1999 Hayashi ....................... 331/67
5,950,908 A * 9/1999 Fujino et al. ............. 228/248.1
6,457,633 B1 * 10/2002 Takashima et al. ...... 228/248.1
6,482,679 B1 * 11/2002 Kato et al. ................... 438/121

* cited by examiner

Primary Examiner—M. Alexandra Elve
Assistant Examiner—Colleen P. Cooke
(74) Attorney, Agent, or Firm—Keating & Bennett, LLP

(57) ABSTRACT

There is provided a method for forming end-face electrodes in which the end-face electrode can be securely formed with solder at a position in which a side electrode is formed and it can be formed without being affected by a jig for fixing a solder solid. By forming linear gaps on a master substrate, module substrates and a waste substrate are formed. At the side end of the gap of the module substrate, a side electrode is formed. A solder solid is pressed into the part of the gap in which the side electrode is formed and a reflow jig is placed. The surface of the solder solid is coated with flux and the solder solid is melted by heating so as to form the end-face electrode protruding from the substrate surface in the side electrode.

9 Claims, 11 Drawing Sheets

METHOD FOR FORMING END-FACE ELECTRODE

BACKGROUND OF THE INVENTION

1. Field of the Invention

The present invention relates to a method for forming end-face electrodes, and in particular relates to a method for forming end-face electrodes with solder on an end-face of a substrate having electronic components such as module components mounted thereon.

2. Description of the Related Art

FIG. 18 is a plan view of a master substrate used in a conventional forming method of end-face electrodes. A master substrate 1 has plural linear gaps 2 formed thereon. With these gaps 2, plural rectangular module substrates 3 are formed on the master substrate 1 and a waste substrate 4 is formed therearound. On an end face of the module substrate 3, which opposes the waste substrate 4 interposing the gap 2 therebetween, plural side electrodes 5 are formed with spacing between adjacent electrodes 5. On the module substrate 3, electrode patterns (not shown) are formed. Then, electronic components (not shown) are mounted on the module substrate 3, so that the electronic components and the electrode patterns are connected together so as to form circuits. In order to connect the circuits formed in such a manner to an external circuit, the electrode patterns are connected to the side electrodes 5 formed at ends of the module substrate 3.

To the side electrode 5 of the module substrate 3, an end-face electrode being convex relative to the master substrate 1 is formed with solder. For that purpose, as is shown in FIG. 19, a jig for fixation 6 is placed for fixing a solder solid on the master substrate 1. In addition, the master substrate 1 is coated with flux in advance. In the jig for fixation 6, a through-hole 7 is formed at a position corresponding to the side electrode 5, and a spherical solder solid 8 is inserted into the through-hole 7. By heating the solder solid 8 in this state, it is melted so as to hang down from the side electrode 5. Then, by cooling the master substrate 1, an end-face electrode 9 is formed to the side electrode 5 with solder, as shown in FIG. 20.

By cutting the master substrate 1 after forming the end-face electrodes 9, plural module components are obtained. At this time, the waste substrate 4 is removed. When mounting the module component obtained in such a manner on a motherboard, the end-face electrode 9 is placed on an electrode formed on the motherboard, to which the module component is connected by reflow.

In the conventional method for forming end-face electrodes, however, because the jig for fixation is used for arranging a solder solid in a position at which the side electrode is formed, a positional shift of the solder solid or non-contact between the side electrode and the solder solid occur if a position of the side electrode and a through-hole of the jig for fixation do not correspond completely to each other. Therefore, there may be cases where an end-face electrode of solder is not formed to the side electrode.

The solder solid is heated for melting in a state in which the jig for fixation overlaps with the master substrate, so that a number of jigs are required in mass production of module components. At this time, thermal deformation of the jig for fixation may occur. During heat treatment, flux may stick to the jig for fixation. When the jig for fixation is thermally deformed or the flux sticks to the jig, end-face electrodes may not be formed properly.

SUMMARY OF THE INVENTION

Accordingly, it is a principal object of the present invention to provide a method for forming end-face electrodes in which the end-face electrode of solder can be securely formed at a location in which a side electrode is formed and it can be formed without being affected by a jig for fixing solder solids. Moreover, the present invention provides a method for forming end-face electrodes in which a substrate having solder solids held at precise positions without using a jig for fixing solder solids can be heat-treated.

A method for forming end-face electrodes according to the present invention comprises the steps of preparing a substrate having gaps with side electrodes, each side electrode being formed at one of side ends opposing each other via the gap, pressing a solder solid into the gap of the substrate in order to hold the solder solid in the area where the side electrode is provided within the gap, and forming an end-face electrode on the side electrode by heating the substrate to melt the solder solid such that the end-face electrode protrudes from the substrate surface.

In the method for forming end-face electrodes, a part of the solder solid or the whole of the solder solid may be pressed into the gap.

It is preferable that hollows be formed at least at the end of the substrate in which the side electrode is formed.

It is also preferable that flux or solder paste be applied in the area into which the solder solid is pressed after the solder solid is pressed into the gap.

By pressing the solder solid into the gap of the substrate, the solder solid can be securely held to the part in which the side electrode is formed. Therefore, by melting the solder solid held in the gap, the end-face electrode made from solder protruding from the substrate surface can be formed in the side electrode with certainty.

When pressing the solder solid into the gap, a part of the solder solid or the whole of the solder solid may be pressed into the gap as long as the solder solid is held in contact with the side electrode. At this time, the solder solid may be deformed or may be held in a substantially non-deformed state.

By forming the hollow at the end of the substrate in which the side electrode is formed, the solder solid can be positioned by the hollow. At this time, the hollow may be formed in the part opposing the side electrode via the gap.

After the solder solid is pressed into the gap, the solderability of the solder solid to the side electrode is improved by coating it with flux when melting the solder solid, enabling the end-face electrode to be securely formed in the side electrode. Furthermore, when using solder paste instead of the flux, while electronic components are mounted on the substrate so as to be connected to the side electrode, the end-face electrode can be formed in the side electrode. After pressing the solder solids into hollows, the end-face electrodes may be formed by applying a solder paste. Electronic components to be mounted on the substrate can be soldered to electrode patterns by the solder paste. By using the solder paste, two steps of forming the end-face electrodes and mounting the electronic components can be performed at the same time. This enables reduction of the number of manufacturing processes and cost.

According to the present invention, a method for forming end-face electrodes may further comprise the steps of preparing a distribution plate in which holes for distributing solder solids are provided at locations corresponding to portions where the side electrodes are formed, placing the distribution plate onto the substrate, distributing solder solids into the gaps through the holes for distributing of the distributing plate, and pressing the solder solids into the gaps from above the distributing plate.

In such a method for forming end-face electrodes, the pressing the solder solids into the gaps may be performed with a roller from above the distribution plate after placing the distribution plate onto the substrate.

Also, the pressing the solder solids into the gaps may be performed with a planar plate from above the distribution plate after placing the distribution plate onto the substrate.

Also, the pressing the solder solids into the gaps may be performed with a pressing plate having projections corresponding to the holes for distributing by inserting the projections into the holes for distributing after placing the distribution plate onto the substrate.

It is preferable that when pressing solder solids into the substrate by using the roller or the planar plate, the distribution plate be removed after the solder solids are pressed into the gaps of the substrate, and the pressing be performed again from above the solder solids as principal pressing.

By using the distribution plate having holes for distributing solder solids, solder solids can be distributed into the gaps of the substrate at positions where the side electrodes are formed. In this state, by pressing the solder solids into the gaps from above the distribution plate, the solder solids can be held at precise positions. Thereafter, the solder solids are melted by the heat-treatment of the substrate, so that the end-face electrodes protruding with respect to the substrate are formed. Since the solder solids are pressed at the precise positions of the substrate, a jig for fixing solder solids is not required during the heat-treatment of the substrate. This eliminates the effect due to a warp of the jig for fixation, etc., resulting in reduction of defects in forming the end-face electrodes.

The pressing of the solder solids into the gaps may be performed with the roller from above the distribution plate or with the planar plate. Also, the solder solids may be pressed into the gaps by using the pressing plate having projections formed by corresponding to the holes for distributing so as to insert the projections into the holes for distributing.

When only the pressing from above the distribution plate is insufficient, the principal pressing may be performed so as to completely press the solder solids into the gaps after removing the distribution plate.

According to the present invention, by pressing solder solids into recesses formed on a module substrate, the solder solids can be held in contact with side electrodes formed on the module substrate securely. Therefore, end-face electrodes can be formed on the side electrodes with certainty by melting the solder solids. Also, because a jig for positioning solder solids is not required, flux cannot adhere to the jig, so that a defect for forming end-face electrodes due to the jig is not produced, resulting in improving yield in forming end-face electrodes.

Furthermore, when end-face electrodes are formed by printing solder paste after pressing solder solids into the recesses, electronic components mounted on the substrate with solder paste can be soldered to electrode patterns. In such a manner, by using the solder paste, the forming of the end-face electrodes and the mounting of the electronic components can be simultaneously performed, enabling reduction in the number of manufacturing processes and cost down of module components to be achieved.

According to the present invention, during forming end-face electrodes on a substrate, solder solids can be pressed at precise positions of the substrate in gaps formed on the substrate. Therefore, when melting solder solids by the heat-treatment of the substrate, a jig for fixing solder solids is not required. Thereby, the effect due to a warp of the jig for fixation produced during the heat-treatment is eliminated, preventing defects in forming end-face electrodes.

These and other objects, features, and effects of the present invention will become more apparent from the following embodiments of the present invention described in detail with reference to the drawings.

DESCRIPTION OF THE PREFERRED EMBODIMENTS

Figure 1:
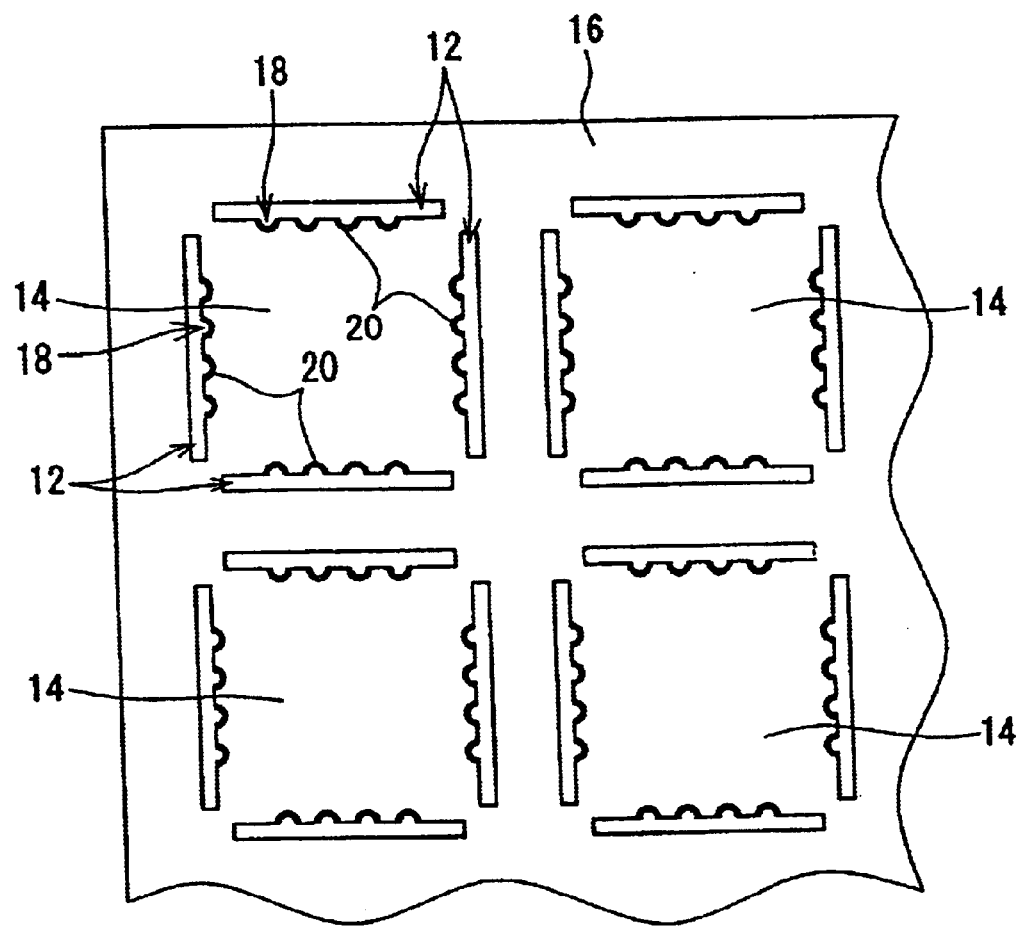
FIG. 1 is a plan view of a master substrate used in a forming method of end-face electrodes according to the present invention.

FIG. 1 is a plan view illustrating a master substrate used in a forming method of end-face electrodes according to the present invention. A master substrate 10 is provided with plural linear gaps 12 formed thereon. With these gaps 12, plural rectangular module substrates 14 are formed and a waste substrate 16 is formed therearound. At an end of the module substrate 14 in the side of the gap 12, plural semi-spherical hollows 18 are formed with spacing between adjacent hollows 18. In the hollow 18, a side electrode 20 is formed so as to come on one principal plane or on both the principal planes of the hollow 18 from an end face thereof. On one plane of the module substrate 14, electrode patterns (not shown) are formed, to which electronic components (not shown) are fitted so as to form plural circuits. In order to connect the circuits formed in such a manner to an external circuit, the electrode patterns are connected to the side electrodes 20. By cutting these plural circuits, plural module components are formed.

Figure 2:
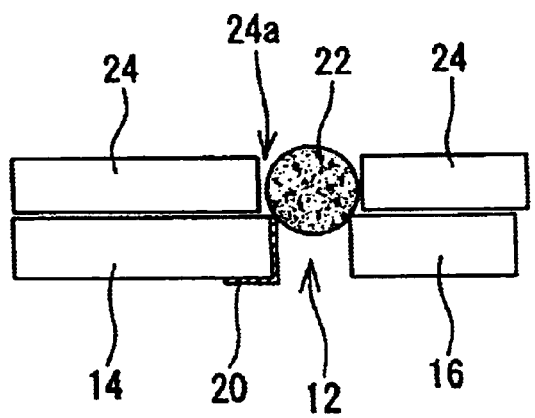
FIG. 2 is a schematic representation showing a state of a solder solid distributed into a hollow of the master substrate shown in FIG. 1 by using a jig for distribution.

In order to mount the module components, which are finally obtained, on a motherboard, etc., end-face electrodes are formed with solder to the side electrodes 20. In that purpose, as shown in FIG. 2, a spherical solder solid 22 is placed on a part of the side electrode 20. At this time, a jig for distribution 24 is used, which has a through-hole formed at a position corresponding to the side electrode 20. By distributing the solder solid 22 into the through-hole 24a of the jig for distribution 24, the solder solid 22 is placed on a part of the side electrode 20. In addition, because the hollows 18 are formed in a part on which the side electrode 20 of the module substrate 14 is formed, the solder solid 18 is positioned into the hollow 18. The through-hole 24a formed on the jig for distribution 24, therefore, is not for fixing the solder solid 22, so that it is sufficient to have an enough size for distributing the solder solid 22 in the vicinity of the side electrode 20.

Figure 3:
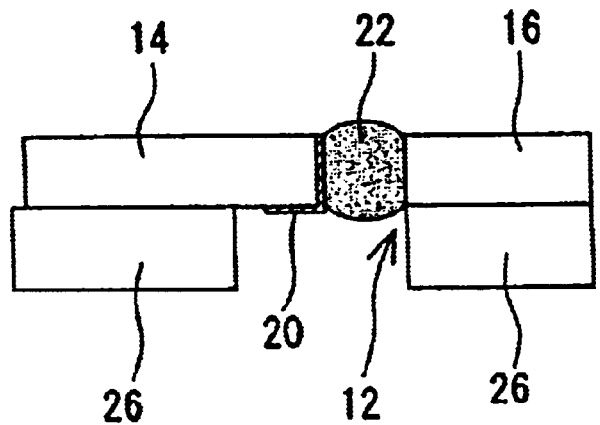
FIG. 3 is a schematic representation showing a state that the solder solid is pressed into the hollow of the master substrate and a reflow jig is placed thereon.

The solder solid 22 placed on the side electrode 20, as shown in FIG. 3, is pressed into the gap 12 by press working.

The press working is performed by sandwiching the master substrate 10 and the solder solid 22 between flat plates under a pressure of 10 kg/point, for example. By pressing the solder solid 22 into the gap 12 in such a manner, the solder solid 22 is held in contact with the side electrode 20. Then, the surface of the master substrate 10 is coated with flux and the solder solid 22 is melted by reflow at a temperature between 220 and 240° C. in an atmosphere of $N_2$. At this time, in order to prevent the master substrate 10 from deforming, a plate-like reflow jig 26 may be placed along the master substrate 10 except the gap 12 and the side electrode 20, as shown in FIG. 3.

Figure 4:
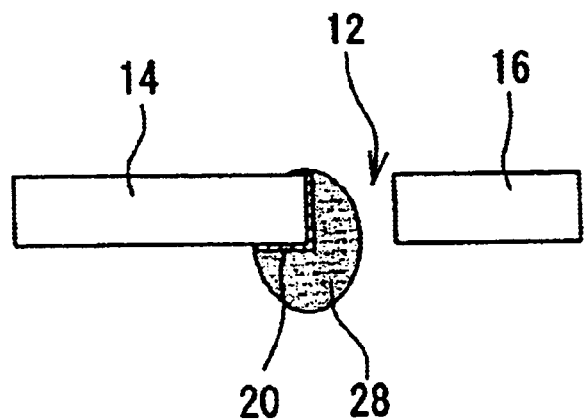
FIG. 4 is a schematic representation showing a state of an end-face electrode formed by solder in a side electrode.

When the solder solid 22 is melted, solderability of the side electrode 20 is promoted due to the function of the flux, so that melted solder sticks to the side electrode 20. By cooling the solder in this state, as shown in FIG. 4, an end-face electrode 28 being convex relative to the surface of the master substrate 10 is formed with solder in the side electrode. The module substrates having circuits formed thereon are separated by cutting the master substrate 10 having the end-face electrodes 28 formed thereon so as to obtain plural module components 14. At this time, the waste substrate 16 is removed. When mounting the module component obtained in such a manner on a motherboard, the end-face electrode 28 is placed on an electrode pattern formed on the motherboard, and the side electrode 20 of the module component and the electrode pattern of the motherboard are soldered together by reflow.

When such a method for forming end-face electrodes is adopted, the solder solid 22 can be securely brought into contact with the side electrode 20 by pressing the solder solid 22, thereby forming the end-face electrode 28 in the side electrode 20 with certainty. The non-defective rate in formation of the end-face electrodes 28 can be therefore improved. Also, because the jig for positioning the solder solid 22 is not required, reduction in cost can be promoted. Furthermore, because the jig for positioning the solder solid 22 is not used when melting the solder solid 22, such defectives as produced due to flux sticking to the jig can be avoided.

Figure 5:
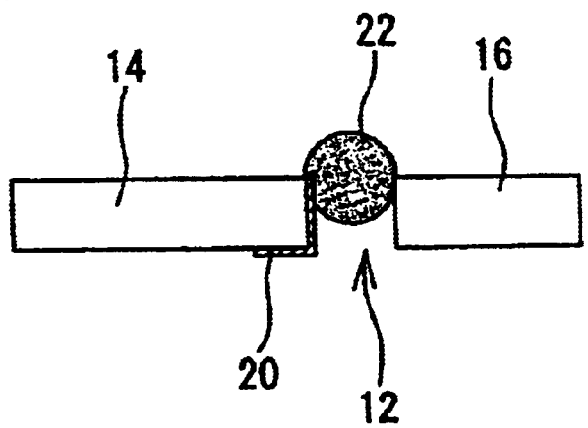
FIG. 5 is a schematic representation showing an example of the pressed state of the solder solid.
Figure 6:
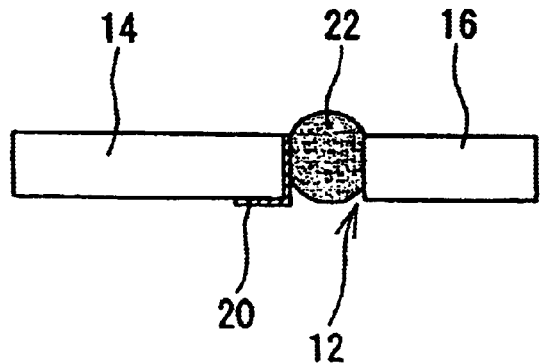
FIG. 6 is a schematic representation showing an another example of the pressed state of the solder solid.
Figure 7:
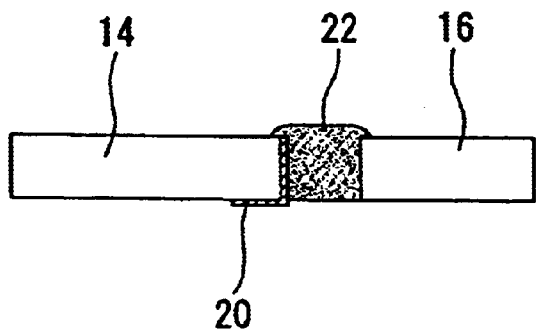
FIG. 7 is a schematic representation showing a still another example of the pressed state of the solder solid.

In addition, when pressing the solder solid 22 into the gap 12, as shown in FIG. 5, it may be pressed to an intermediate portion of the master substrate 10 in the thickness direction; or it may be pressed to the bottom surface of the master substrate 10, as shown in FIG. 6. When pressing the solder solid 22 to the bottom surface of the master substrate 10, the solder solid 22 may not be deformed much, as shown in FIG. 6; or the solder solid 22 may be deformed so as to plug the most part of the hollow 18, as shown in FIG. 7. In such a manner, regardless of the pressing extent and the deformation existence of the solder solid 22, the end-face electrode 28 can be certainly formed as long as the solder solid 22 is held in contact with the side electrode 20.

Figure 8:
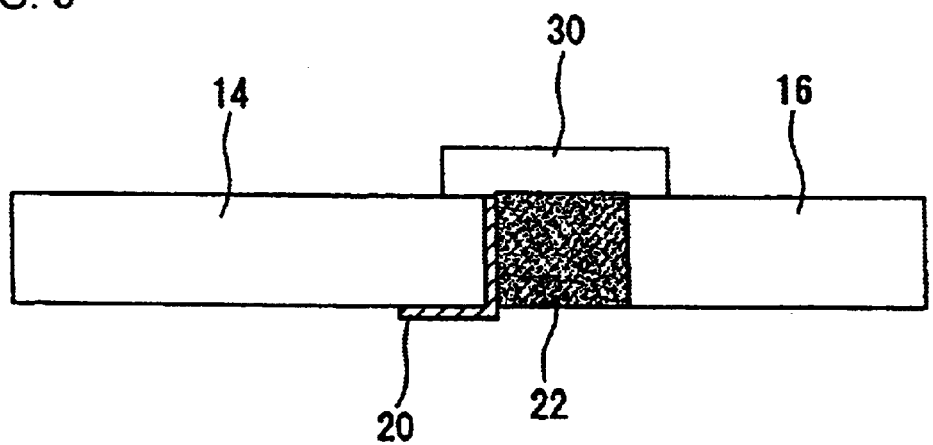
FIG. 8 is a schematic representation showing a state that the solder solid pressed into the hollow is printed with solder paste thereon.

Also, as shown in FIG. 8, the end-face electrode 28 may be formed by printing solder paste 30 on one surface of the master substrate 10 so as to melt the solder solid 22 after pressing the solder solid 22 into the gap 12 of the master substrate 10. In this case, while the solderability between the side electrode 20 and the melted solder solid 22 is improved by the solder paste 30, electronic components mounted on the module substrate 14 can be soldered to the electrode pattern. In such a manner, by using the solder paste 30 instead of the flux, the forming of the end-face electrode 28 and the mounting of electronic components can be simultaneously carried out. In addition, it is preferable that the solder solid 22 be deformed so as to plug the hollow 18.

Figure 9:
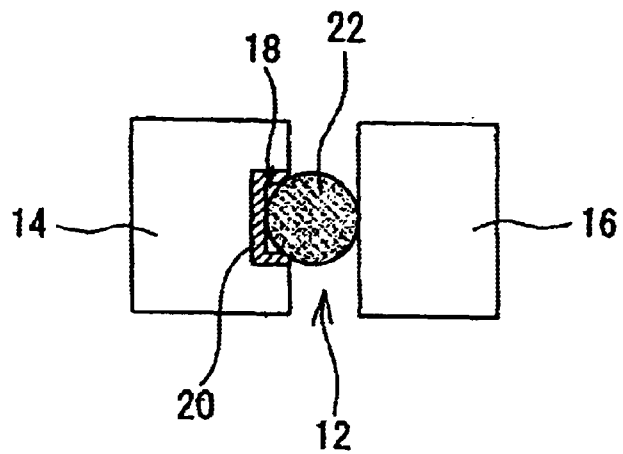
FIG. 9 is a schematic representation showing another example of the hollow formed on a module substrate.
Figure 10:
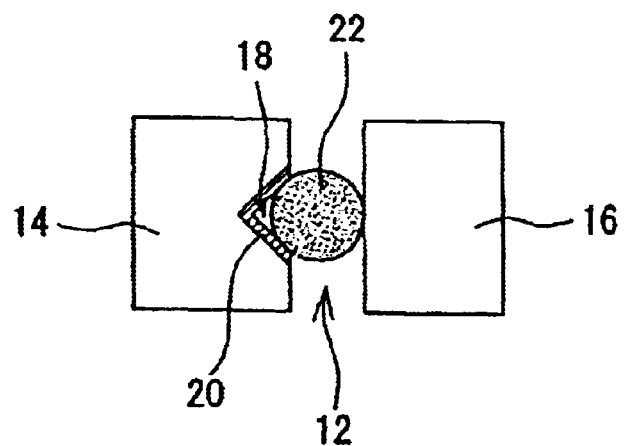
FIG. 10 is a schematic representation showing still another example of the hollow formed on the module substrate.
Figure 11:
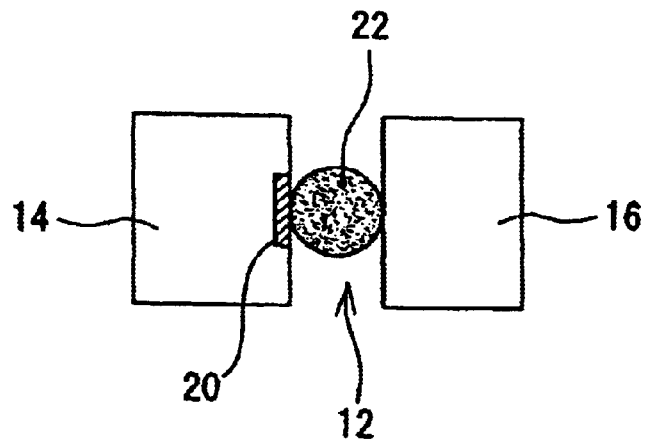
FIG. 11 is a schematic representation showing an example of the module substrate not having the hollow formed thereon.

The shape of the hollow 18 formed in the module substrate 14 is not only semi-circular as shown in FIG. 2 but also it may be rectangular shown in FIG. 9 or triangular as shown in FIG. 10. In such a manner, the shape of the hollow 18 formed in the module substrate 14 may be arbitrarily changeable as long as the solder solid 22 can be positioned in a part of the side electrode 20. Also, as shown in FIG. 11, the hollow 18 may not be formed. In this case, although it is needed to prevent the positional shift of the solder solid 22, the end-face electrode 28 can be securely formed when pressing the solder solid 22 into the gap 12 just like in the case of the master substrate 10 having the hollows 18.

Figure 12:
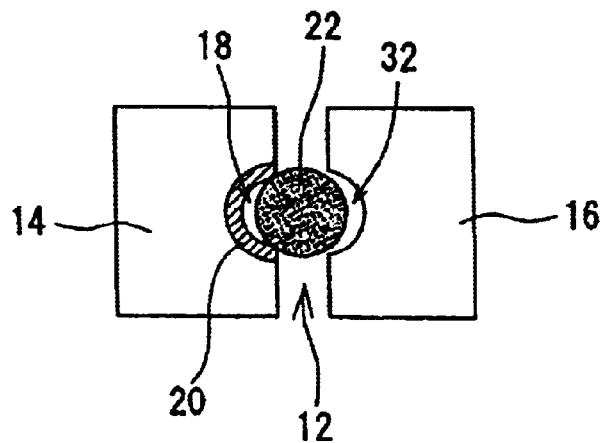
FIG. 12 is a schematic representation showing an example of the hollow formed on a waste substrate.
Figure 13:
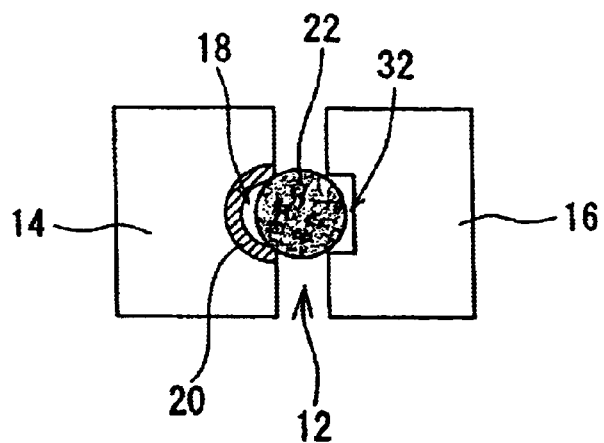
FIG. 13 is a schematic representation showing another example of the hollow formed on a waste substrate.
Figure 14:
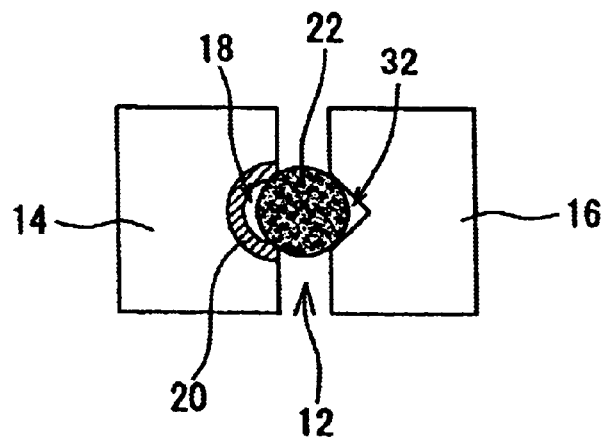
FIG. 14 is a schematic representation showing still another example of the hollow formed on a waste substrate.

In order to improve the accuracy in positioning the solder solid 22 furthermore, as shown in FIG. 12, a semi-circular hollow 32 may be formed in the waste substrate 16 opposing the hollow 18. By forming the hollow 32 also in the waste substrate 16 in such a manner, the accuracy in positioning the solder solid 22 can be improved in collaboration with the hollow 18 in the module substrate 14. In the waste substrate 16, the hollow 32 may of course be rectangular as shown in FIG. 13 or triangular as shown in FIG. 14.

Figure 15:
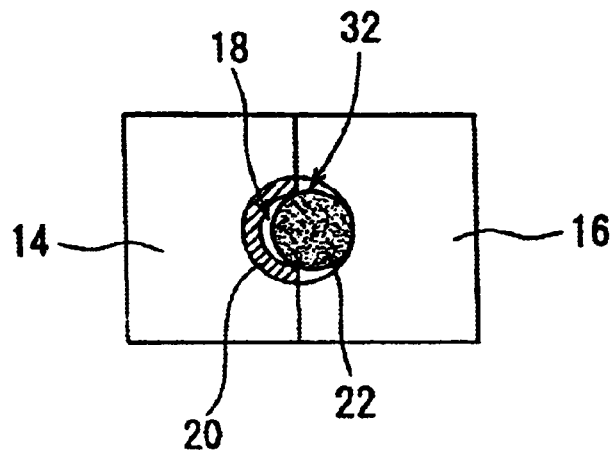
FIG. 15 is a schematic representation showing an example of the gap formed by the hollow of the module substrate and the hollow of the waste substrate.
Figure 16:
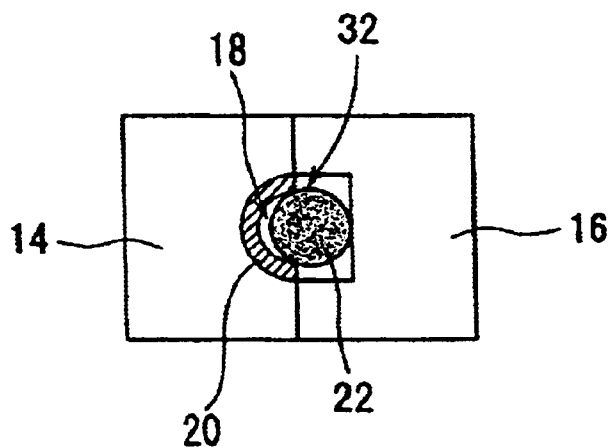
FIG. 16 is a schematic representation showing another example of the gap formed by the hollow of the module substrate and the hollow of the waste substrate.
Figure 17:
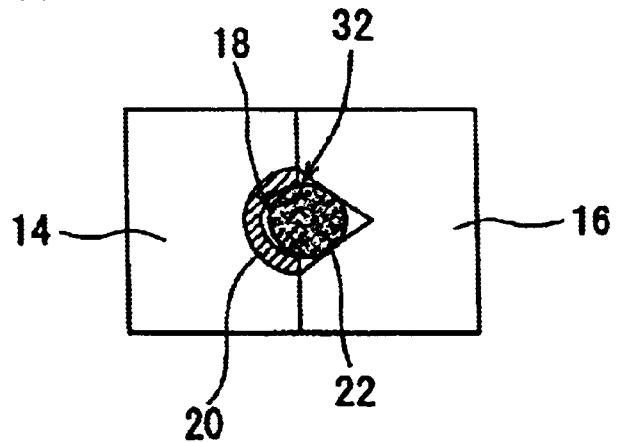
FIG. 17 is a schematic representation showing still another example of the gap formed by the hollow of the module substrate and the hollow of the waste substrate.
Figure 18:
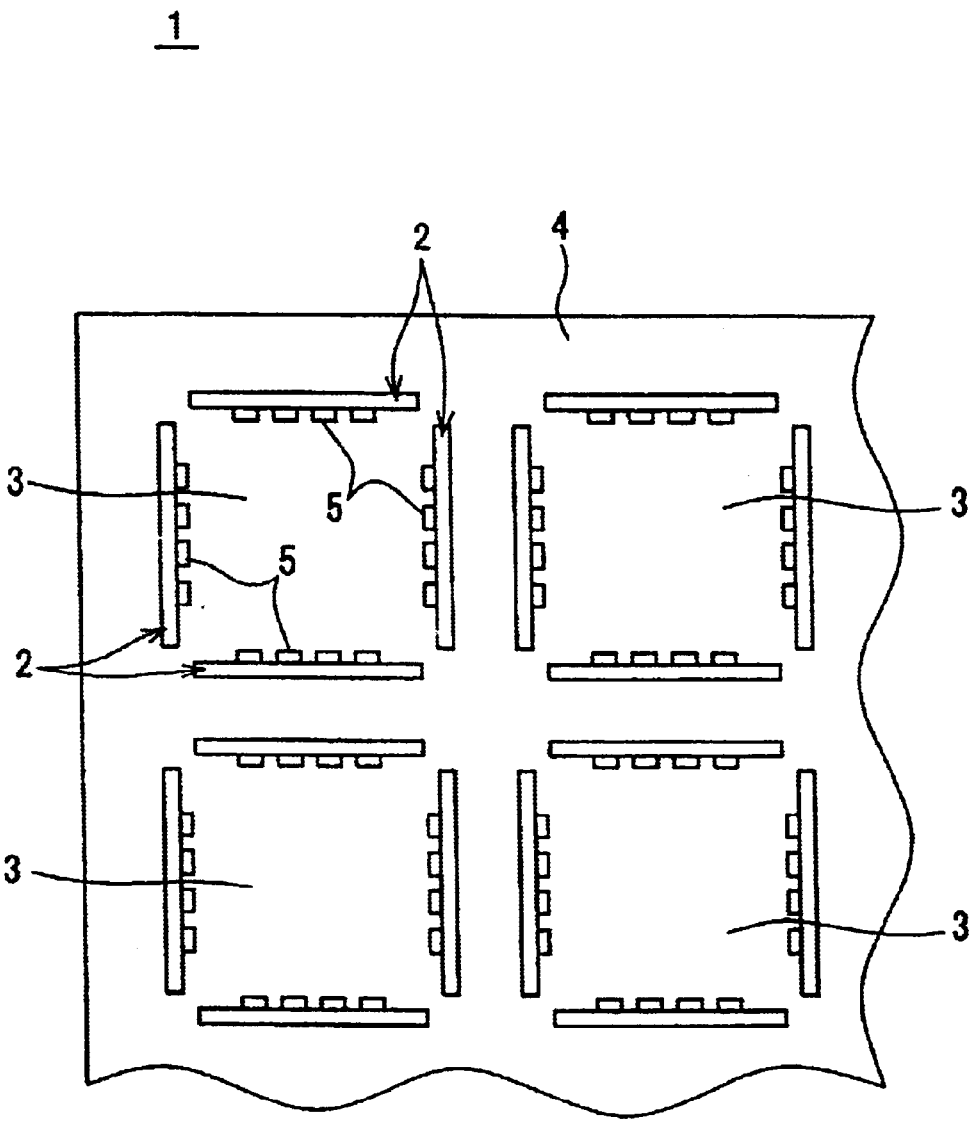
FIG. 18 is a plan view showing an example of the master substrate used in a conventional forming method of end-face electrodes.
Figure 19:
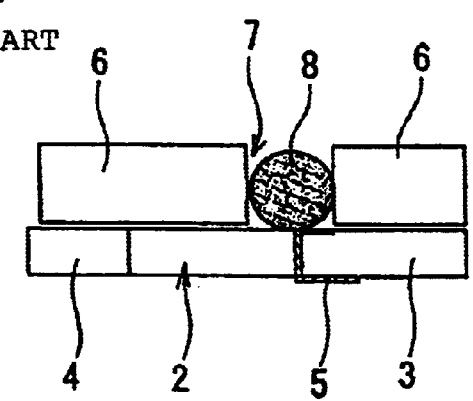
FIG. 19 is a schematic representation showing a state that the solder solid is held on the master electrode by a conventional method.
Figure 20:
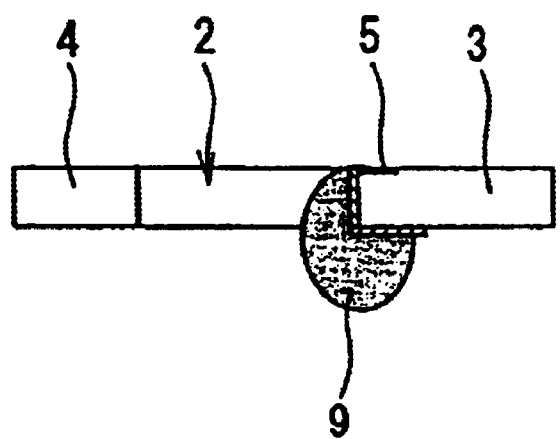
FIG. 20 is a schematic representation showing a state that the end-face electrode is formed by solder in the side electrode by a conventional method.

Furthermore, the gap is not limited to be linear; it may be formed by the hollow 18 of the module substrate 14 and the hollow 32 of the waste substrate 16. That is, as shown in FIG. 15, the two hollows 18 and 32 may be formed between the module substrate 14 and the waste substrate 16, and the module substrate 14 may be closely stuck to the waste substrate 16 except the part of the hollows 18 and 32. In this case, the solder solid 22 can be also pressed in contact with the side electrode 20 formed in the part of the hollow 18. The shape of the hollow 32 in the waste substrate 16 may also be semi-circular as shown in FIG. 15, and it may be rectangular shown in FIG. 16, or triangular as shown in FIG. 17. In FIGS. 15 to 17, the rift between the module substrate 14 and the waste substrate 16 may not be formed. In this case, by finally cutting the master substrate 10 between the two hollows 18 and 32, module parts can be obtained.

In addition, the solder solid 22 may have not only a spherical shape but also any one of shapes such as columnar, conical, hemispherical, prismatic, pyramidal, and T-shaped shapes as long as it can be pressed into the hollow 18. The material of the solder solid 22 may be any metallic composition such as SnPb, SnAg, SnCu, SnSb, SnBi, SnZn, and SnAgCu, and it may be a material coated thereon.

Figure 21:
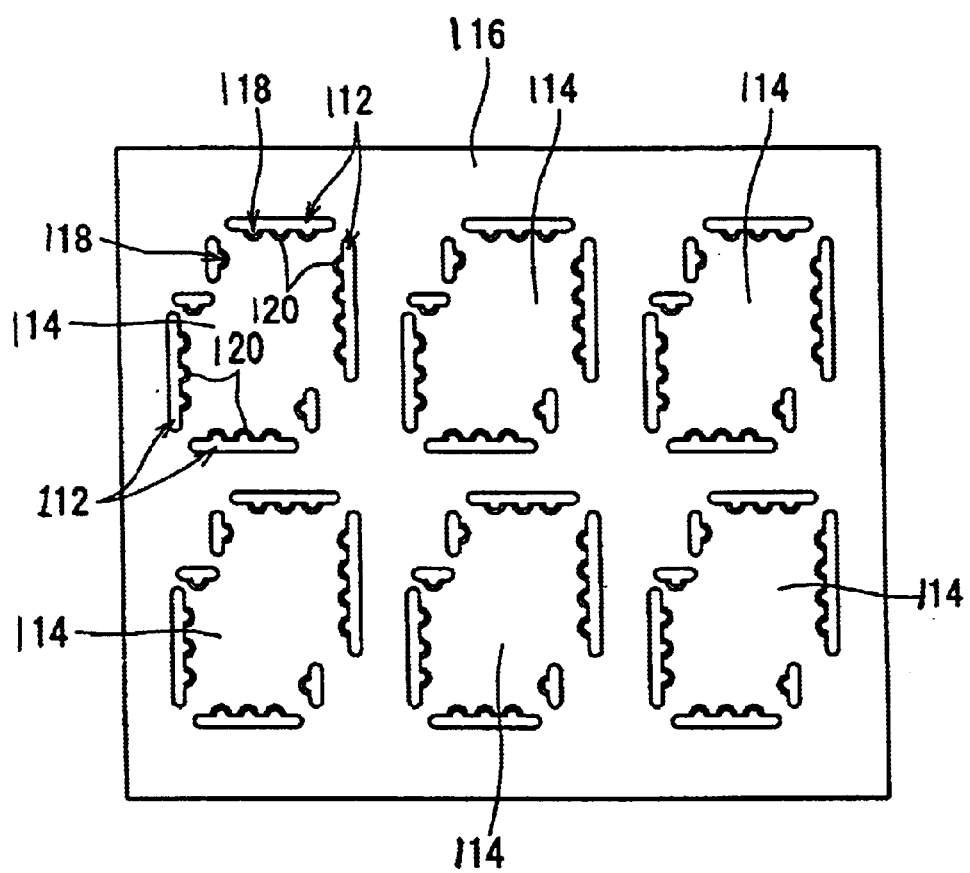
FIG. 21 is a plan view of an example of a master substrate to which a forming method of end-face electrodes according to the present invention is applied.

FIG. 21 is a plan view of an example of a master substrate used in a method for forming end-face electrodes according to the present invention. On a master substrate 110, plural straight gaps 112 are formed along the external shapes of required module substrates. By these gaps 112, plural rectangular module substrates 114 are formed, and waste substrates 116 are formed at the periphery of the module substrates 114. The master substrate 110 may have a thickness of 0.7 mm, and the gap 112 may have a size of 0.85 mm, for example.

At one end of the module substrate 114 in the side of the gap 112, plural semicircular recesses 118 are formed separated with the gap 112 therebetween. The recess 118 may have a diameter of 0.7 mm, for example. The recess 118 is provided with a side electrode 120 formed so as to come on one principal surface or both principal surfaces from the end-face. On one surface of the module substrate 114, electrode patterns (not shown) are formed, so that plural electronic components (not shown) are mounted on the electrode patterns so as to form plural circuits. In order to connect the circuits formed in such a manner to an external circuit, the electrode patterns are connected to the side electrodes 120. By cutting these plural circuits, plural module components are formed.

Figure 22:
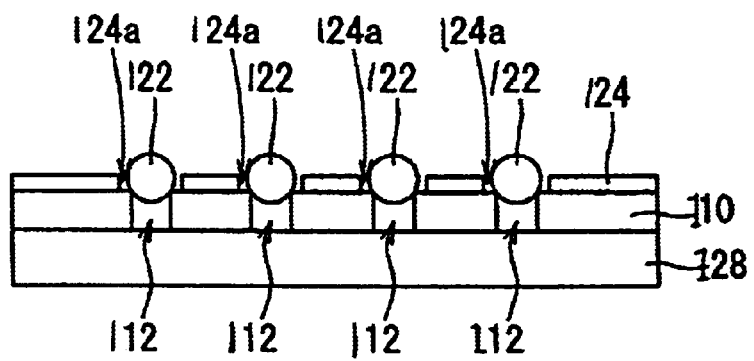
FIG. 22 is a schematic sectional representation showing a state that solder solids are placed by putting a jig for distribution onto the master substrate shown in FIG. 21.

In order to mount the finally obtained module component on a motherboard, etc., an end-face electrode is formed on the side electrode 120 with solder. To this end, as shown in FIG. 22, a spherical solder solid 122 having a diameter of 1.1 mm, for example is placed on part of the side electrode 120. At this time, a distribution plate 124 having holes 124a for distribution formed at positions corresponding to the side electrodes 120 is put on the master substrate 110. The hole 124a for distribution is formed to have a diameter of 1.5 mm, for example. By distributing solder solids 122 into the holes 124a for distribution of the distribution plate 124, the solder solid 122 is placed on part of the side electrode 120.

Figure 23:
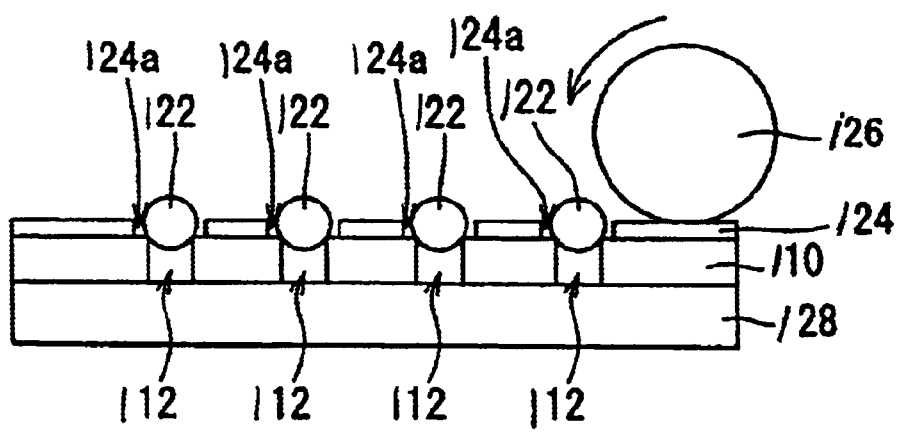
FIG. 23 is a schematic sectional representation showing a state that tops of the solder solids shown in FIG. 22 are pressurized with a roller.

In a state that the distribution plate 124 is put on the master substrate 110, as shown in FIG. 23, a roller 126 is moved in one direction or moved back and forth thereon, so that the solder solids 122 are pressed into the gaps 112 of the master substrate 110. In order to press the solder solids 122 into the gaps 112 by the roller 126, it is necessary that the solder solid 122 protrude through the top of the distribution plate 124. Therefore, the distribution plate 124 having a thickness of 0.3 mm is used, for example.

As the roller 126, a hand roller having a diameter of 40 mm, for example, and made of stainless steel is used and moved by an operator. In order to prevent damage of the master substrate 110 at this time, an under plate 128 for pressing is arranged on the bottom surface of the master substrate 110. In addition, when the number of the solder solids 122 is large, a force applied to one solder solid 122 becomes smaller so that the solder solids 122 cannot be completely pressed into the master substrate 110; however, they can be pressed thereinto to an extent that the solder solid 122 cannot move within the gap 112 of the master substrate 110. The extent of pressing the solder solid 122 can be adjusted by setting the number of movements of the roller 126.

Figure 24:
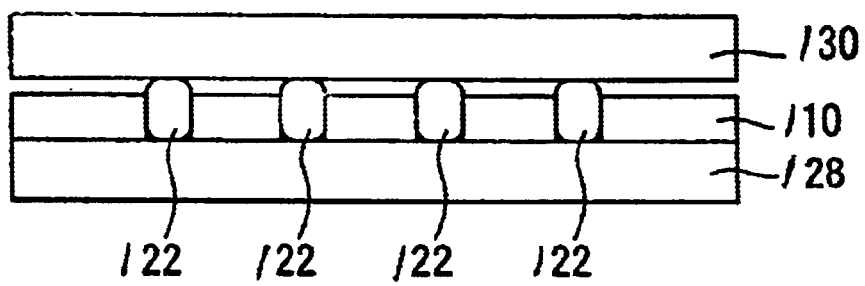
FIG. 24 is a schematic sectional representation showing a state that principal pressing is performed with a planar upper plate for pressing after pressing solder solids into the master substrate with a roller.

Next, as shown in FIG. 24, after removing the distribution plate 124, principal pressing is performed on the solder solids 122 by using a planar upper plate 130 for pressing to which mechanical pressure is applied. The principal pressing is performed by applying a pressure of 98 N per one solder solid, for example. The gap 112 is filled with the solder solid 122 by the principal pressing so as to plug the gap 112 of the master substrate 110.

Figure 25:
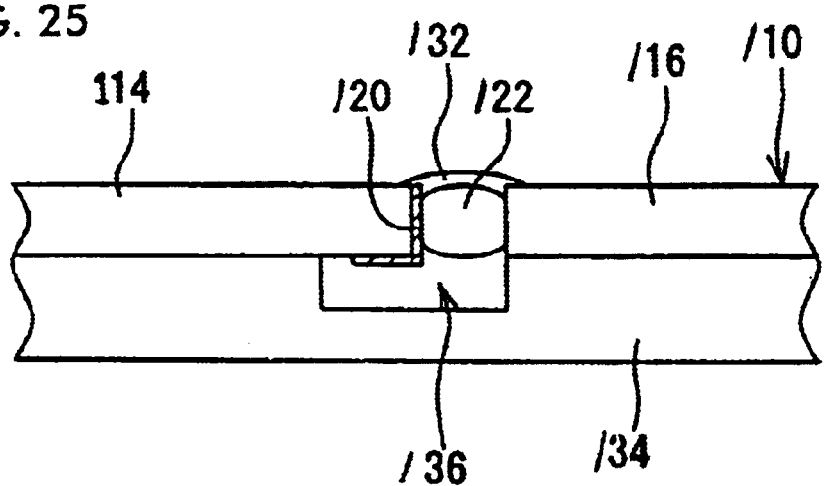
FIG. 25 is a schematic sectional representation showing a state that tops of solder solids are coated with flux after the principal pressing shown in FIG. 24.
Figure 26:
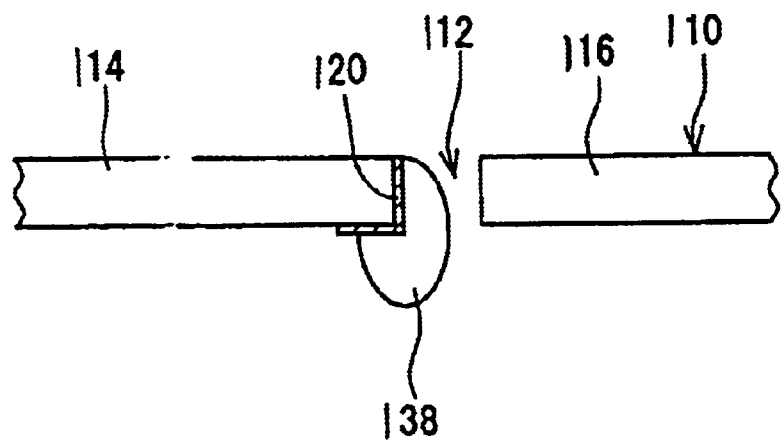
FIG. 26 is a schematic sectional representation showing a state that end-face electrodes are formed by heat-treating the master substrate having solder solids pressed thereinto.

After the gaps 112 of the master substrate 110 are filled with the solder solids 122, as shown in FIG. 25, the solder solids 122 are coated with flux 132 and are melted by heating so as to adhere to the side electrodes 120. It is preferable that a jig for preventing warping 134 be arranged on the bottom surface of the master substrate 110 so as not to produce a warp on the master substrate 110 at this time. In the jig for preventing warping 134, recesses 136 are formed at positions corresponding to the gaps 112 of the master substrate 110, so that melted solder cannot adhere to the jig for preventing warping 134. As shown in FIG. 26, by cooling the solder when the melted solder adheres to the side electrode 120, an end-face electrode 138 is formed to protrude from the bottom surface of the master electrode 110.

On the master substrate 110 having the end-face electrodes 138 formed thereon, electronic components such as ICs are mounted, which in turn is cut so as to divide it into the module substrates 114 and the waste substrates 116, thereby obtaining plural module components. At this time, the waste substrates 116 are removed. When the module component is mounted on a motherboard, etc., the end-face electrode 138 is placed on an electrode pattern of the motherboard, and the side electrode 120 of the module component and the electrode pattern of the motherboard are soldered by reflow process.

When such a forming method of end-face electrodes is adopted, because the solder solids 122 are pressed into the gaps 112 from above the distribution plate 124 with the roller 126, the solder solid 122 can be securely pressed within at a predetermined position. Therefore, when forming the end-face electrodes 138 by heat-treating, a jig for fixing the solder solids 122 is not required. Moreover, because the solder solid 122 is pressed within at a predetermined position, the end-face electrode 138 can be securely formed to part of the side electrode 120 without a positional shift.

Figure 27:
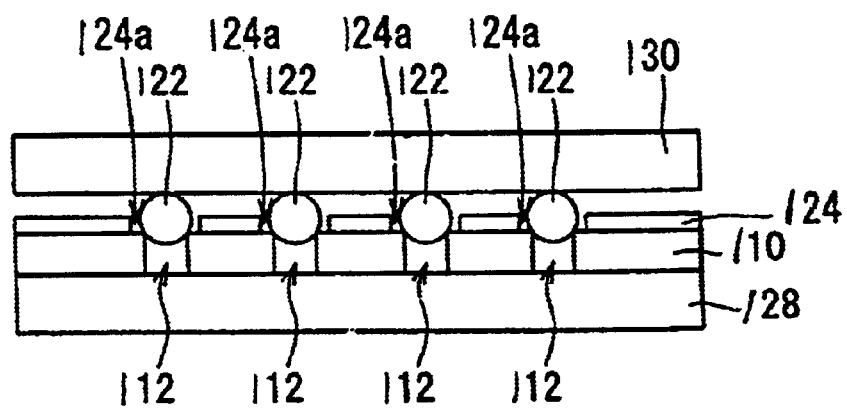
FIG. 27 is a schematic sectional representation showing a state that tops of the solder solids shown in FIG. 22 are pressed with the planar upper plate for pressing.

When pressing the solder solids 122 thereinto from above the distribution plate 124, as shown in FIG. 27, pressure may also be mechanically applied thereto by using the planar upper plate 130 for pressing. In this case, the force can be equally applied to the entire solder solids 122, so that the operation can be performed within a short period of time. Since the solder solid 122 is protruding above the master substrate 110 by the thickness of the distributing plate 124 also in this case, the principal pressing is performed after removing the distributing plate 124. When using the above-mentioned roller 126 or upper plate 130 for pressing, the principal pressing is not necessarily performed as long as the melted solder adheres to the side substrate 120 during the heat-treating.

Figure 28:
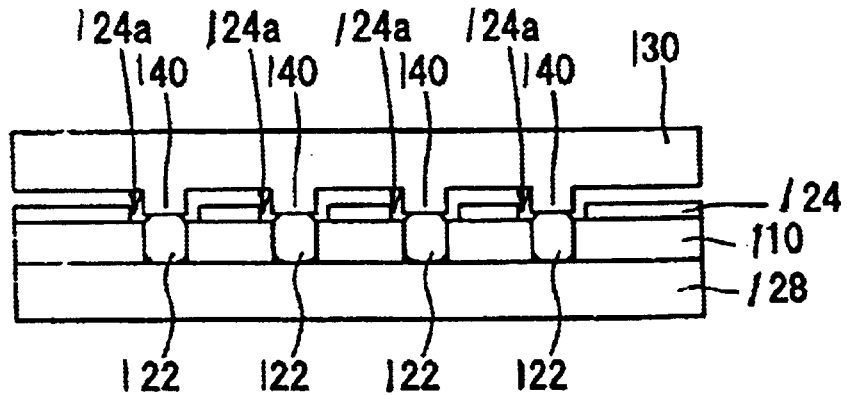
FIG. 28 is a schematic sectional representation showing a state that tops of the solder solids shown in FIG. 22 are pressed with an upper plate for pressing having projections.

Furthermore, as shown in FIG. 28, the upper plate 130 for pressing having projections 140 formed thereon may be used. The projections 140 are formed at positions corresponding to the holes 124a for distribution of the distribution plate 124. The solder solids 122 can be pressed into the gaps 112 by pressing so as to insert the projections 140 into the holes 124a for distribution of the distribution plate 124. The solder solids 122 can be completely pressed into the gaps 112 without performing the principal pressing for this case. At this time, the pressing is performed under a pressure of 98 N per one solder solid 122, for example.

When using the upper plate 130 for pressing having the projections 140 formed thereon, it is not necessary that the solder solids 122 protrude above the distribution plate 124, so that limits associated with the thickness of the master substrate 110, the diameter of the solder solid 122, and the thickness of the distribution plate 124 can be relaxed.

By pressing the solder solids 122 from above the distribution plate 124 in such a manner, the solder solids 122 can be pressed into the master substrate 110 at precise positions. Accordingly, the end-face electrodes 138 can be formed at precise positions in the master substrate 110. Therefore, a positional shift of the end-face electrode 138 may be prevented, thereby improving yield. Also, because the heat-treatment is performed in a state that the solder solids 122 are pressed into the gaps 112, a jig for fixing solder solids is not required, so that the affect due to the thermal deformation of the jig for fixation is eliminated, enabling defects in forming the end-face electrodes 138 to be reduced.

In addition, the semicircular recesses 118 are formed on the master substrate 110; however, such recesses are not necessarily required. That is, even to the side substrates 120 formed at regular intervals to the straight gaps 112 formed on the master substrate 110, the solder solids 122 may be distributed at precise positions with the distribution plate.

Moreover, the recesses 118 may be formed in the side of the waste substrate 116. As described above, by forming the recesses in the side of the module substrate 114 or the waste substrate 116, the stability of the solder solid 122 can be increased. The shape of the recess is not limited to a semicircle; another shape such as a triangle and a rectangle may be adopted.

What is claimed is:

1. A method for forming end-face electrodes comprising the steps of:

preparing a substrate having gaps with side electrodes, each side electrode being formed at one of side ends opposing each other via the gap;

pressing a solder solid into the gap of the substrate in order to hold the solder solid in the area where the side electrode is provided within the gap; and forming an end-face electrode on the side electrode by heating the substrate to melt the solder solid such that the end-face electrode protrudes from the substrate surface.

2. A method according to claim 1, wherein the step of pressing a solder solid comprises pressing one of a part of the solder solid and the whole of the solder solid.

3. A method according to claim 1, wherein hollows are formed at least at the end of the substrate in which the side electrode is formed.

4. A method according to claim 1, further comprising a step of applying one of flux and solder paste in the area into which the solder solid is pressed after the solder solid is pressed into the gap.

5. A method according to claim 1, further comprising the steps of:

preparing a distribution plate in which holes for distributing solder solids are provided at locations corresponding to portions where the side electrodes are formed;

placing the distribution plate onto the substrate;

distributing solder solids into the gaps through the holes for distributing of the distributing plate; and pressing the solder solids into the gaps from above the distributing plate.

6. A method according to claim 5, wherein pressing the solder solids into the gaps is performed with a roller from above the distribution plate after placing the distribution plate onto the substrate.

7. A method according to claim 5, wherein pressing the solder solids into the gaps is performed with a planar plate from above the distribution plate after placing the distribution plate onto the substrate.

8. A method according to claim 5, wherein pressing the solder solid into the gaps is performed with a pressing plate having projection corresponding to the holes for distributing by inserting the projections into the holes for distributing after placing the distribution plate onto the substrate.

9. A method according to claim 6, further comprising the steps of:

removing the distributing plate after pressing the solder solids into the gaps of the substrate; and pressing again from above the solder solids as principal pressing.

* * * * *